(12) United States Patent
Kitaoka (10) Patent No.: US 8,760,191 B2
(45) Date of Patent: Jun. 24, 2014

(54) RECONFIGURABLE SEMICONDUCTOR INTEGRATED CIRCUIT

(75) Inventor: Toshirou Kitaoka, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/471,008

(22) Filed: May 14, 2012

(65) Prior Publication Data

US 2012/0223737 A1    Sep. 6, 2012

Related U.S. Application Data

(62) Division of application No. 13/017,878, filed on Jan. 31, 2011, now Pat. No. 8,299,815.

(30) Foreign Application Priority Data

Feb. 1, 2010 (JP) ................................ 2010-020406

(51) Int. Cl.
*H03K 19/173* (2006.01)
(52) U.S. Cl.
USPC .............................................. 326/38; 326/41
(58) Field of Classification Search
USPC ..................................................... 326/37–41
See application file for complete search history.

(56) References Cited

U.S. PATENT DOCUMENTS

| 6,208,163 | B1 * | 3/2001 | Wittig et al. ..................... 326/39 |
| 6,469,540 | B2 * | 10/2002 | Nakaya ........................... 326/41 |
| 6,526,559 | B2 * | 2/2003 | Schiefele et al. ............... 326/11 |
| 2001/0038298 | A1 | 11/2001 | Marshall et al. |

FOREIGN PATENT DOCUMENTS

| JP | 2000-224025 A | 8/2000 |
| JP | 2001509336 A | 7/2001 |
| JP | 2001-312481 A | 11/2001 |
| JP | 2002-076883 A | 3/2002 |
| JP | 2002538634 A | 11/2002 |
| JP | 2003-076668 A | 3/2003 |
| JP | 2008-015772 A | 1/2008 |
| WO | 0052826 A2 | 9/2000 |

OTHER PUBLICATIONS

Office Action issued by Japanese Patent Office in corresponding Japanese Patent application No. 2010-020406, dated May 30, 2013.

* cited by examiner

*Primary Examiner* — Don Le
(74) *Attorney, Agent, or Firm* — Sughrue Mion, PLLC (57) ABSTRACT

A semiconductor integrated circuit includes: a plurality of the functional blocks; a plurality of configuration data memories in which a plurality of configuration data are stored; and a plurality of programmable switches configured to control connection between said plurality of functional blocks based on one of the plurality of configuration data which is stored in a common one of said plurality of configuration data memories.

8 Claims, 11 Drawing Sheets

RECONFIGURABLE SEMICONDUCTOR INTEGRATED CIRCUIT

INCORPORATION BY REFERENCE

This application is a divisional application of U.S. application Ser. No. 13/017,878 filed Jan. 31, 2011, which claims priority from Japanese Patent Application No. 2010-020406 filed on Feb. 1, 2010, which applications are incorporated herein by reference.

TECHNICAL FIELD

The present invention is related to a semiconductor integrated circuit and a method of reconfiguring of the semiconductor integrated circuit.

BACKGROUND ART

As a processor unit by which various types of data processing can be flexibly executed, products such as so-called CPU (Central Processing Unit) and MPU (Micro Processor Unit) have come into a practical use at present.

In a data processing system using such a processor unit, an application program in which a plurality of instruction codes are described, and various types of processing data are stored in a memory device. The processor unit sequentially reads the instruction codes and the processing data from the memory device and executes a plurality of types of calculation processing.

The processor unit can realize various types of data processing but has to sequentially execute the plurality of types of calculation processing. Also, because the processor unit has to read one instruction code from the memory device for every processing, it is difficult to execute complicated data processing at high speed.

On the other hand, when data processing to be executed is limited to a single type of processing, the processor unit can avoid the sequential processing by forming an executing section of the data processing in hardware. That is, it is not necessary to sequentially read the plurality of instruction codes from the memory device and to sequentially execute the data processing. However, a logic circuit in hardware can execute complicated data processing at high speed, but can execute only the single type of data processing.

In other words, the data processing system in which application programs can be switched freely can execute various types of data processing but it is difficult to execute the data processing at high speed. On the other hand, the logic circuit in hardware can execute the data processing at high speed but only the single type of data processing can be executed because the application program cannot be switched.

It is a reconfigurable circuit that is provided between these extreme examples. This is a device that can be reconfigured to a predetermined different configuration (logic) according to a necessity. Therefore, the reconfigurable circuit provides a possibility of a computer in which hardware resources are changed to satisfy a need of present computation through appropriate reconfiguration.

In the reconfigurable circuit, many small-scale functional blocks are arranged in a matrix, and an operation of each of many functional blocks and the connection relation of many operation units connected by programmable interconnection resources are switched according to an application program.

The reconfigurable circuit can execute various types of data processing, because the hardware configuration is changed by changing the application program. Also, the reconfigurable circuit can execute the data processing at high speed because the many small-scale functional blocks in hardware execute simple calculation processes in parallel.

The various type of data processing can be realized by the reconfigurable circuit, and various types of programmable interconnection resources are contrived to make it possible to perform an efficient connection between the functional blocks and various circuits. For example, a reconfigurable circuit which has a plurality of interconnection resources of different types in attribute is disclosed in JP 2002-076883A (Patent Literature 1) and JP 2003-076668A (Patent Literature 2). Also, a reconfigurable circuit having a plurality of configurations is disclosed in JP 2000-224025A (Patent Literature 3) and JP 2001-312481A (Patent Literature 4).

In the reconfigurable circuit disclosed in Patent Literature 1, uniform programmable interconnections (interconnection resources) are used in a horizontal direction in which multi-bit data is transferred. Here, high performance multi-bit data path can be efficiently implemented by using programmable interconnections (interconnection resources) suitable for processing in units of an ALU (Arithmetic and Logic Unit) in a same vertical direction as an extension direction of the ALU unit.

In the reconfigurable circuit disclosed in Patent Literature 2, interconnection resources are separately used for m-bit width data path and n-bit width data path (n<m) to efficiently execute data processing of many bits (m-bit) and data processing of small bits (n-bit).

Figure 1:
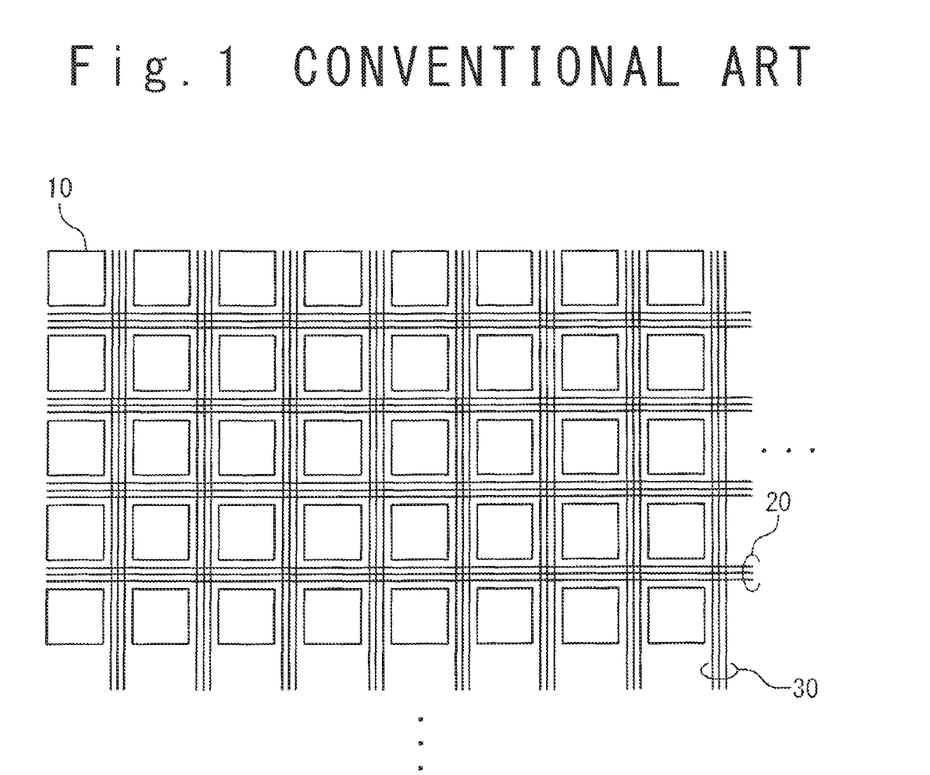
FIG. 1 is a diagram showing a general configuration of a semiconductor integrated circuit.

In the reconfigurable circuit, many functional blocks 10 are arranged in a matrix, as shown in FIG. 1. The functional block 10 is configured by arithmetic and logic calculation units exemplified by an ALU unit, a register file, a memory and so on and can set a variety of logical functions in a programmable manner.

Also, the reconfigurable circuit can realize various functions by freely changing the connection relation among the functional blocks 10 by the programmable interconnection resources (buses 20 and 30).

A programmable switch (not shown) to switch the connection relation among the interconnection resources (buses 20 and 30) in the reconfigurable circuit is controlled by a storage element (hereinafter, to be referred to as a configuration data memory) such as a memory and flip-flops (FF). For example, the configuration data memory which stores a plurality of configuration data is disclosed in JP 2008-15772A (Patent Literature 5).

In the above-mentioned Patent Literatures and conventional techniques, programmable switch elements such as an NMOS (N-channel Metal Oxide Semiconductor) transistor, a transmission gate, a tri-state buffer, and a multiplexer are controlled based on the configuration data corresponding to only the elements.

CITATION LIST

[Patent Literature 1]: JP 2002-076883A
[Patent Literature 2]: JP 2003-076668A
[Patent Literature 3]: JP 2000-224025A
[Patent Literature 4]: JP 2001-312481A
[Patent Literature 5]: JP 2008-15772A

SUMMARY OF THE INVENTION

The reconfigurable circuit has an advantage of great flexibility in a circuit configuration, compared with a dedicated circuit such as ASIC (Application Specific Integrated Circuit). However, the reconfigurable circuit has a drawback in redundancy of the circuit configuration. The reconfigurable circuit is provided with a plurality of functional blocks to manipulate change of the circuit configuration, a configuration data memory which stores circuit configuration data, and so on. Also, the programmable switch to switch the connection relation among the functional blocks needs a wider area, compared with an interconnection area in a dedicated circuit. Therefore, when a circuit having a desired function is configured as a reconfigurable circuit, an integration degree is low and area efficiency is also low, compared with a case to configure a circuit having a same function as a dedicated circuit. For example, when a circuit that performs an arithmetic operation of "(A+B)*(C+D)=Y", is realized respectively by a reconfigurable circuit and a dedicated circuit, the redundancy of the reconfigurable circuit is apparent, as described in Patent Literature 5. Therefore, area reduction is required for the purpose of improvement of competitiveness of the reconfigurable circuit. However, because there is no value of the reconfigurable circuit if the flexibility of the circuit configuration is lost, a technique is demanded to reduce a circuit area while keeping the flexibility of the circuit configuration.

In designing a reconfigurable circuit, a ratio between a plurality of types of interconnection resources with different attributes such as a horizontal direction and a vertical direction, and an m-bit width and an n-bit width is determined in advance, and then the design is started. Also, after the start of the design, the ratio cannot be changed. Accordingly, even if the ratio is suitable in efficiency for a target at the design stage, the efficiency would be low for others. The generality is lost if the configuration is specialized for a type of processing, and oppositely, the efficiency is relatively degraded if the generality is aimed.

If the interconnection resources are prepared for the maximum number needed for each of different attributes such as the direction and the bit width, the circuit area increases explosively and the area efficiency reduces. This is because when one application is selected, the interconnection resources with the attributes for other applications are not used. Also, the increase of the area causes the increase of the interconnection length so that a delay increases, which degrades the performance.

When the number of applications of the reconfigurable circuit is increased, high performance in each application cannot be expected, and when the application is specialized, the generality of the reconfigurable circuit is degraded. Also, it would be sometimes necessary to perform the processing of a type different from that of the design stage by the reconfigurable circuit in future. In such a case, there is a fear that the reconfigurable circuit is completely unsuitable for the type of processing.

When the ratio between the attributes is unbalanced, the flexibility would be lost because the characteristic of the reconfigurable circuit becomes clear but the application is specialized. On the other hand, when the attributes are balanced with a same weight, the reconfigurable circuit has generality but the performance is degraded for each of applications. Also, when the interconnection resources are prepared to any attribute for high performance, the circuit area becomes enlarged. In this case, it is expected that only the resource with a specific attribute is used for a type of processing, and the resources of the other attributes are left and wasteful. In other words, most of the increased resources are not used in many types of processing, in addition to the area increase, and the area efficiency become low.

Generally, a configuration data memory occupies a large area in the reconfigurable circuit. For example, as shown in Patent Literature 5, it is apparent that the reconfigurable circuit is redundant in a configuration data memory and programmable switches, compared with the dedicated circuit. Especially, in the reconfigurable circuit which can store a plurality of configuration data, as in Patent Literature 3 and Patent Literature 5, the configuration data memory occupies a large area of the circuit area, because a memory with a plurality of words is used as the configuration data memory. When the number of words of the configuration data is increased in future, a ratio of the area of the configuration data memory to the circuit area increases more and more. Therefore, it is important to reduce the area of the configuration data memory.

In an aspect of the present invention, a semiconductor integrated circuit includes: a plurality of the functional blocks; a plurality of configuration data memories in which a plurality of configuration data are stored; and a plurality of programmable switches configured to control connection between said plurality of functional blocks based on one of the plurality of configuration data which is stored in a common one of said plurality of configuration data memories.

In another aspect of the present invention, a method of switching a configuration of a semiconductor integrated circuit, is achieved by selecting one of a plurality of programmable switches which is supplied with a configuration data from one configuration data memory; and by connecting functional blocks based on the configuration data by said selected programmable switch.

According to the present invention, the circuit area of the reconfigurable circuit can be reduced.

BRIEF DESCRIPTION OF DRAWINGS

The above and other objects, advantages and features of the present invention will be more apparent from the following description of certain embodiments taken in conjunction with the accompanying drawings, in which.

DESCRIPTION OF EMBODIMENTS

Hereinafter, a semiconductor integrated circuit of the present invention will be described with reference to the attached drawings. In the drawings, the same or similar reference numerals are assigned to the same or similar components.

FIG. 1 is a block diagram showing a general configuration of a semiconductor integrated circuit such as a reconfigurable circuit. Referring to FIG. 1, the reconfigurable circuit is provided with a plurality of functional blocks 10 arranged in a matrix (2-dimensional array) and buses 20 and 30 which connect the plurality of functional blocks 10. The functional block 10 attains a function corresponding to an application program, and the function is changed based on configuration data to be described later. The bus 20 extends in a row (horizontal) direction of the functional blocks 10 arranged in the matrix, and the bus 30 extends in a column direction (vertical direction) of the functional blocks 10. The buses 20 and 30 function as programmable interconnection resources and the connection with the functional blocks 10 is controlled by programmable switches. That is, the semiconductor integrated circuit of the present invention realized as the reconfigurable circuit which has two attributes of vertical direction interconnection resources (column direction interconnection resources) and horizontal direction interconnection resources (row direction interconnection resources).

It is desirable that bi-directional buses are used as the buses 20 and 30, because the connection with a high degree of freedom is possible in a smaller area, compared with a case where a single direction interconnection is used. For example, in order to use the buses 20 and 30 as the programmable interconnection resources, the bi-directional bus which uses a tri-state buffer, a pass transistor and so on as the programmable switch is suitable.

In the semiconductor integrated circuit (hereinafter, to be referred to as the reconfigurable circuit) of the present invention, the configuration of the functional block 10 and an operation unit of the functional block 10 which is connected with the buses 20 and 30 are changed, when an application program to be executed is changed. With this, the reconfigurable circuit can attain various functions through the change of the hardware configuration. In this way, the reconfigurable circuit can attain various types of processing by freely changing the connection relation of the functional blocks with the programmable interconnection resources.

Figure 2:
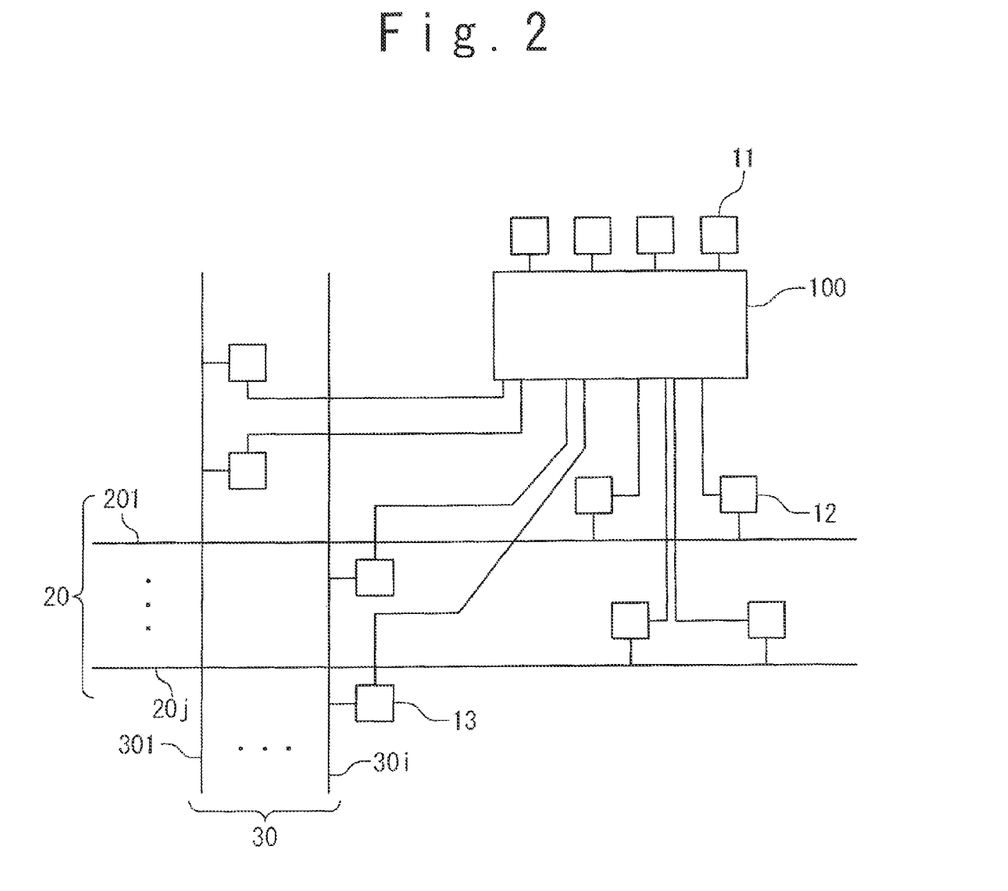
FIG. 2 is a circuit diagram showing a configuration of the semiconductor integrated circuit according to an embodiment of the present invention.

Referring to FIG. 2, the details of the configuration of the programmable interconnection resources which are used for the reconfigurable circuit of the present invention will be described. FIG. 2 is a block diagram showing the configuration of the semiconductor integrated circuit according to an embodiment of the present invention. In the following description, the configuration is shown in which a part of programmable switches in each of the horizontal direction interconnection resources (bus 20) and the vertical direction interconnection resources (bus 30) is controlled with the same configuration data memory.

The reconfigurable circuit of the present invention is provided with a plurality of configuration data memories 11, a plurality of programmable switches 12 and 13 and a memory sharing circuit 100. Also, the bus 20 is provided with a plurality of interconnections 201 to 20j (j is a natural number) and the bus 30 is provided with a plurality of interconnections 301 to 30i (i is a natural number).

The programmable switch 12 controls a connection between the bus 20 (horizontal direction interconnection resources) and the functional block 10, and the programmable switch 13 controls a connection between the bus 30 (vertical direction interconnection resources) and a predetermined arithmetic unit in the functional block 10. In detail, the programmable switch 12 is connected with either of the plurality of interconnections 201 to 20j. In the same way, the programmable switch 13 is connected with either of the plurality of interconnections 301 to 30i. For example, it is desirable that the programmable switches 12 and 13 are realized by transistor switches such as a MOS transistors, a transmission gate, a tri-state buffer, and a multiplexer.

The programmable switches 12 and 13 are connected to the configuration data memory 11 in common through the memory sharing circuit 100, and the switching operation is controlled according to the configuration data stored in the configuration data memory 11. That is, in the present embodiment, the programmable switches 12 and 13 connected with the horizontal direction interconnection resources (the bus 20) and the vertical direction interconnection resources (the bus 30) are controlled based on the configuration data stored in the same configuration data memory 11.

The configuration data memory 11 is exemplified by a storage element such as a memory and flip-flops, and the configuration data to set the configuration of the reconfigurable circuit is stored therein. The memory sharing circuit 100 controls a connection between the configuration data memory 11 and the programmable switches 12 and 13, and selects one of the programmable switches 12 and 13 and connects it with the configuration data memory 11. For example, when one of the programmable switches 12 and 13 and the configuration data memory 11 are connected, the selected one of the programmable switches 12 and 13 connects the functional block 10 and the bus based on the inputted configuration data and the other switch becomes a high impedance condition. Also, the programmable switch which connects the functional block 10 and the bus can be switched by switching the programmable switch connected with the configuration data memory 11. Moreover, if the reconfigurable circuit can realize a predetermined function even though the memory sharing circuit 100 is controlled based on the common configuration data, both of the programmable switches 12 and 13 may be connected with the configuration data memory 11 in common. The specific configuration of the memory sharing circuit 100 will be described later in detail.

It should be noted that an output (configuration data) from the configuration data memory 11 is supplied to the functional block 10, in addition to the programmable switches, and changes the configuration (connection relation) of the arithmetic unit and so on in the functional block 10.

According to the reconfigurable circuit of the present invention, the plurality of programmable switches can use the configuration data memory 11 in common by the memory sharing circuit 100. As a result, it is not necessary to provide the configuration data memory 11 for each programmable switch unlike the conventional example and the number of configuration data memories 11 can be reduced.

Hereinafter, the details of the configuration and operation of the reconfigurable circuit shown in FIG. 2 in the first to fourth embodiments will be described.

First Embodiment

Hereinafter, referring to FIGS. 3 to 7, the reconfigurable circuit according to the first embodiment of the present invention will be described. The first embodiment will be described, in which the validation/invalidation of the programmable switches is switched by using the memory sharing circuit 100. Therefore, because the configuration of the configuration data memory 11 is same as described above, the detailed description is omitted.

Figure 3:
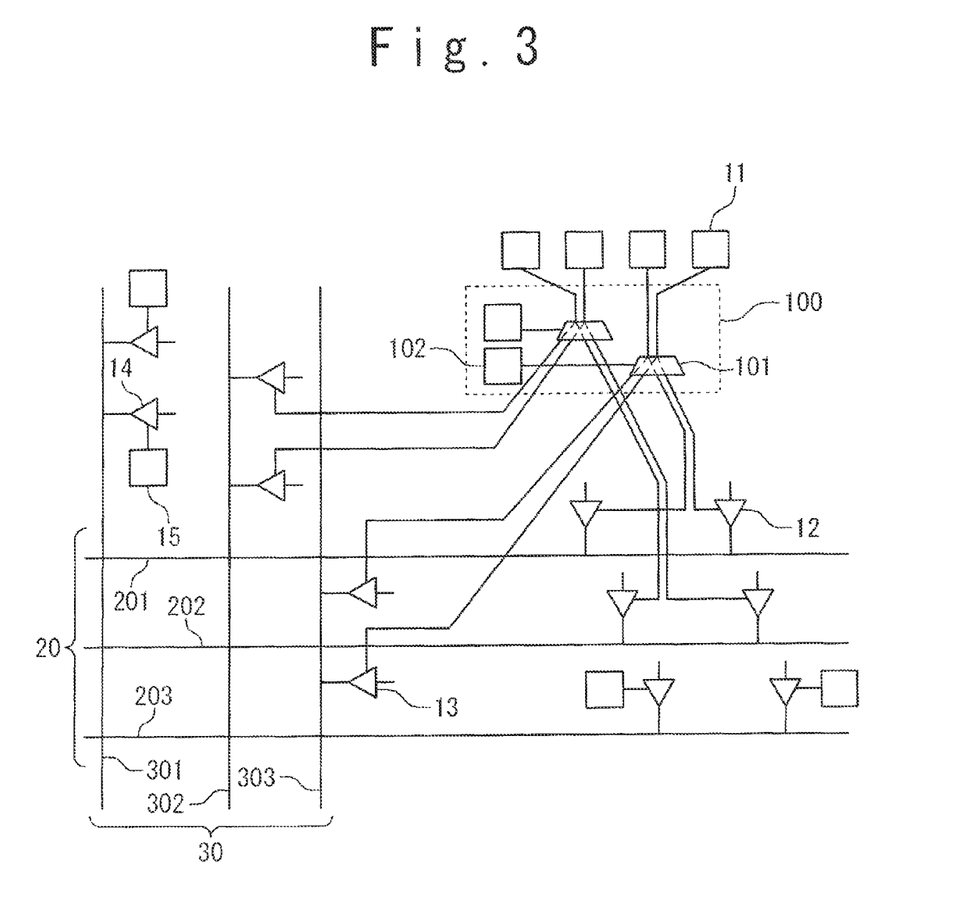
FIG. 3 is a circuit diagram showing the configuration of the semiconductor integrated circuit according to a first embodiment of the present invention.

FIG. 3 is a block diagram showing the configuration of the reconfigurable circuit in the first embodiment. Referring to FIG. 3, the programmable switches 12 and 13 are configured from tri-state buffers, and the memory sharing circuit 100 is provided with the plurality of switches 101 and switching data storage elements 102 connected with the plurality of switches 101. Also, the reconfigurable circuit may be provided with the configuration data memory 15 which is not shared by the plurality of programmable switches based on the function of the device to be configured, and a programmable switch 14 (tri-state buffer) that switching operation is controlled based on the configuration data memory. An example shown in FIG. 3, in which only interconnection 201 to 203 are shown as the bus 20 and only interconnection 301 to 303 are shown as the bus 30, will be described for simplification of explanation.

The memory sharing circuit 100 validates one of the programmable switches 12 and 13 and invalidates the other, based on an application program. The validation and invalidation are controlled based on switching data stored in the switching data storage element 102. The switching circuit 101 connects the configuration data memory and the programmable switch to be validated based on the switching data and disconnects the programmable switch to be invalidated. For example, when the programmable switch is a tri-state buffer, an NMOS transistor, or a transmission gate, that is, when the switch is a programmable switch that collision on the bus occurs possibly, the switching circuit 101 supplies a signal of a predetermined level to the programmable switch to be invalidated to control the output of the switch to be in high impedance.

The switching data storage element 102 may be realized by use of a storage element such as SRAM (Static Random Access Memory) and DRAM (Dynamic Random Access Memory), although a latch and a flip-flop can be used. Also, a non-volatile memory such as flash memory and EPROM (Erasable Programmable Read Only Memory) may be used as the switching data storage element 102. In this case, it is possible to eliminate setting of the switching data every time of start-up. However, it is assumed that it takes a great deal of time when the configuration is switched during operation. However, by using a new non-volatile memory such as MRAM (Magnetic Random Access Memory) and FeRAM (Ferroelectric Random Access Memory) as the switching data storage element 102, such a drawback can be eliminated.

Figure 4:
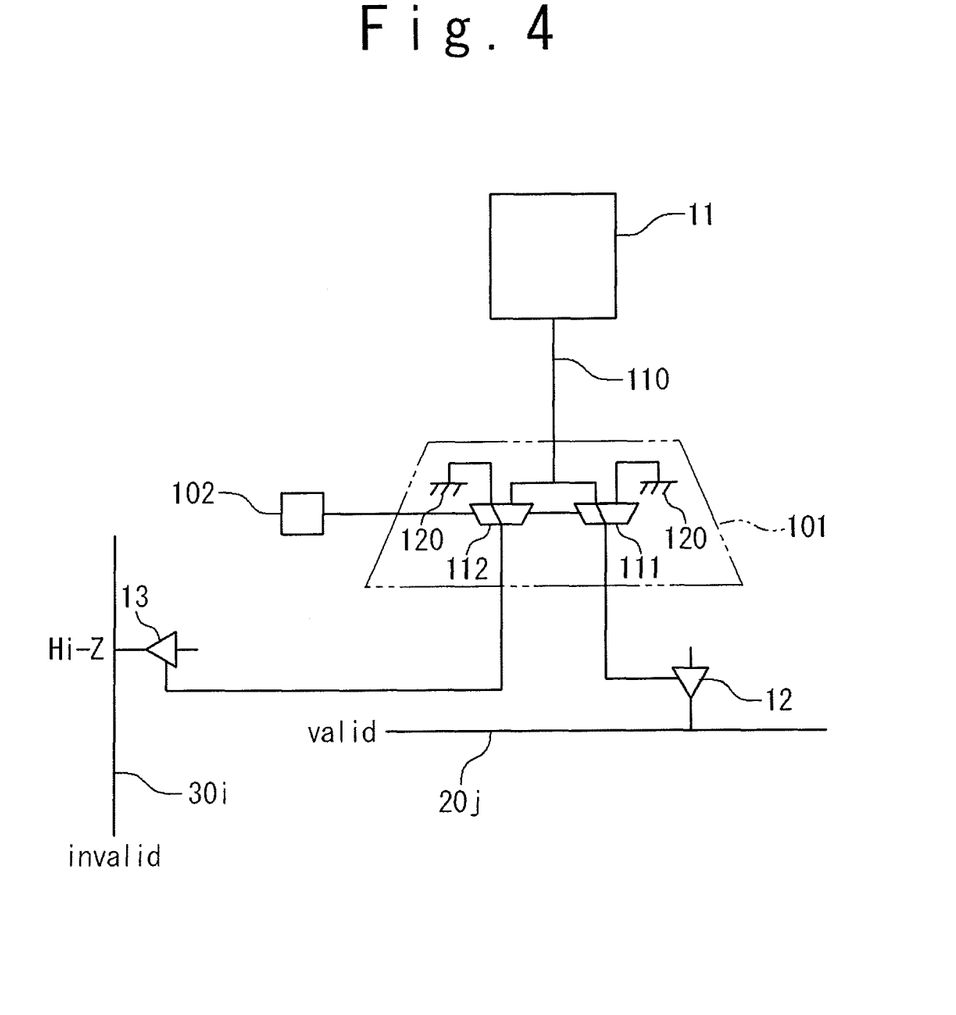
FIG. 4 is a circuit diagram showing the configuration of a switch according to the present invention.

FIG. 4 is a block diagram showing an example of the configuration of the switching circuit 101 according to the present invention. Referring to FIG. 4, the switching circuit 101 is provided with a selector 111 which is connected with a control terminal of the programmable switch 12 and a selector 112 which is connected with a control terminal of the programmable switch 13. The selector 111 selects one of an output 110 from the configuration data memory 11 and a ground terminal 120 based on the switching data and connects the selected one with the programmable switch 12. In a same way, the selector 112 selects one of the outputs 110 from the configuration data memory 11 and the ground terminal 120 based on the switching data and connects the selected one with the programmable switch 13. It is desirable that the switching data is supplied to different terminals in the selectors 111 and 112. For example, in response to the switching data of a high level, the selector 111 connects the output 110 of the configuration data memory 11 and the programmable switch 12 and the selector 112 connects the ground terminal 120 and the programmable switch 13. In this case, the programmable switch 12 is set to be valid and the functional block 10 and the interconnection 20j are connected. On the other hand, the programmable switch 13 is set to be invalid in response to the value of "0" generated in the switching circuit 100. The interconnection 30i connected with the invalided programmable switch 13 is set to a high impedance state to prevent the collision of the bus.

On the other hand, when the switching data of a low level is stored in the switching data storage element 102, the selector 111 connects the ground terminal 120 and the programmable switch 12 and the selector 112 connects the output 110 of the configuration data memory 11 and the programmable switch 13. In this case, the validation and invalidation are inverted from the above-mentioned case and the programmable switch 13 is set to be valid. The functional block 10 and the interconnection 30i are connected and the programmable switch 12 is set to be invalid in response to the value of "0" generated in the switching circuit 100. The interconnection 20j connected with the invalidated programmable switch 12 is set to the high impedance state.

A circuit such as a fuse and an anti-fuse that an interconnection path can be switched only once could be used as the switching data storage element 102. Even in this case, the user can switch based on an application program. Of course, if the switching is performed once, another application program cannot be used.

As mentioned above, in the reconfigurable circuit of the present embodiment, because it is possible to switch the programmable switch to be validated based on the switching data, a plurality of programmable switches can use the configuration data memory 11 in common. As a result, it is not necessary to provide the configuration data memory 11 for every programmable switch unlike the conventional example, and the number of configuration data memories 11 can be reduced.

Figure 5:
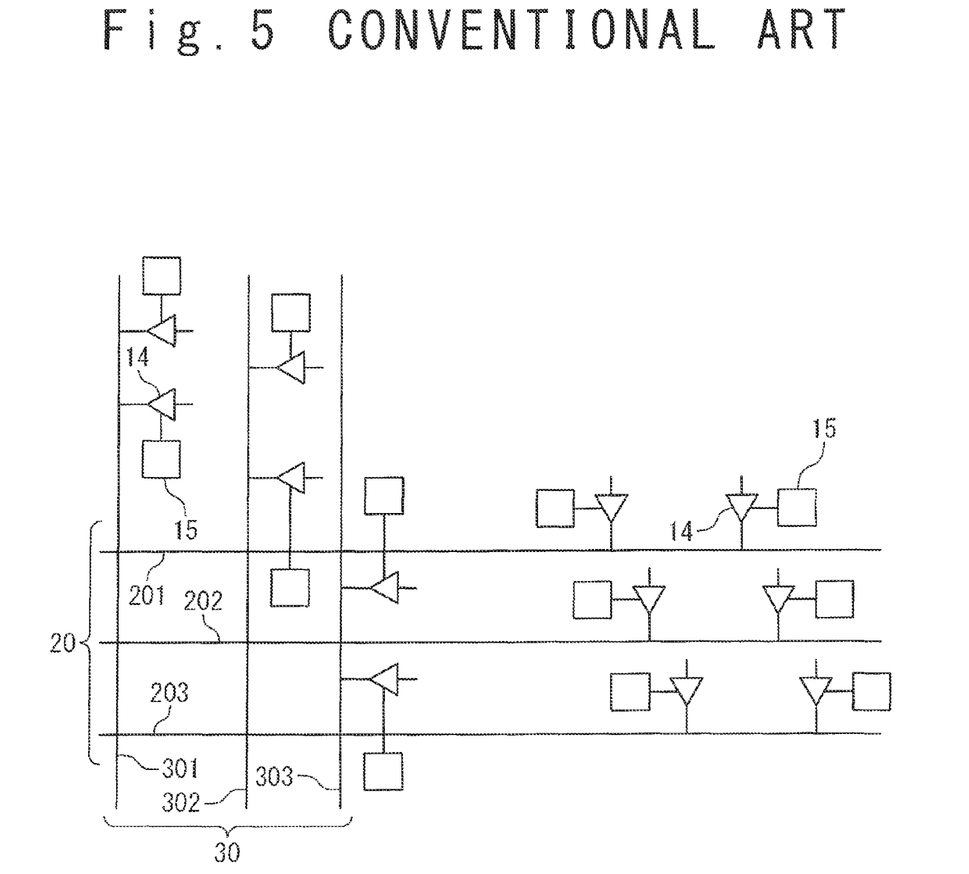
FIG. 5 is a block diagram showing the configuration of a comparison example of the semiconductor integrated circuit of the present invention.

The configuration of the reconfigurable circuit in the conventional example is shown in FIG. 5 as a comparison example of FIG. 3. The reconfigurable circuit in the conventional example is provided with one configuration data memory 15 for each of the plurality of programmable switches 14 which connects the functional block 10 and the buses 20 and 30. That is, each programmable switch 14 is controlled by the configuration data memory 15 assigned to the programmable switch 14.

12 programmable switches (tri-state buffers) which are same are provided for the reconfigurable circuits of the present invention shown in FIG. 3 and of the comparison example shown in FIG. 5. In this case, in the comparison example shown in FIG. 5, it is necessary to prepare the configuration data memory 15 for the number of 12 which is same as the number of programmable switches 14. However, in the reconfigurable circuit of the present invention, the programmable switches 12 and 13 share the configuration data memory 11. In the example shown in FIG. 3, the four programmable switches 12 and 13 uses the four configuration data memories 11 respectively and other four programmable switches 14 use other configuration data memories 15. Therefore, a total of the configuration data memories are eight. Also, the validation and invalidation of the four programmable switches are controlled by the two sets of the switching circuit 101 and the switching data storage element 102. In this case, the number of memories is 10 which is equal to a summation of eight for the configuration data memories and two for the switching data storage elements.

In the above-mentioned example, the memories can be decreased by two. Because the number of programmable switches used in the reconfigurable circuit is enormous, many memories can be decreased by applying the present invention, resulting in great decrease of the circuit area.

Figure 6:
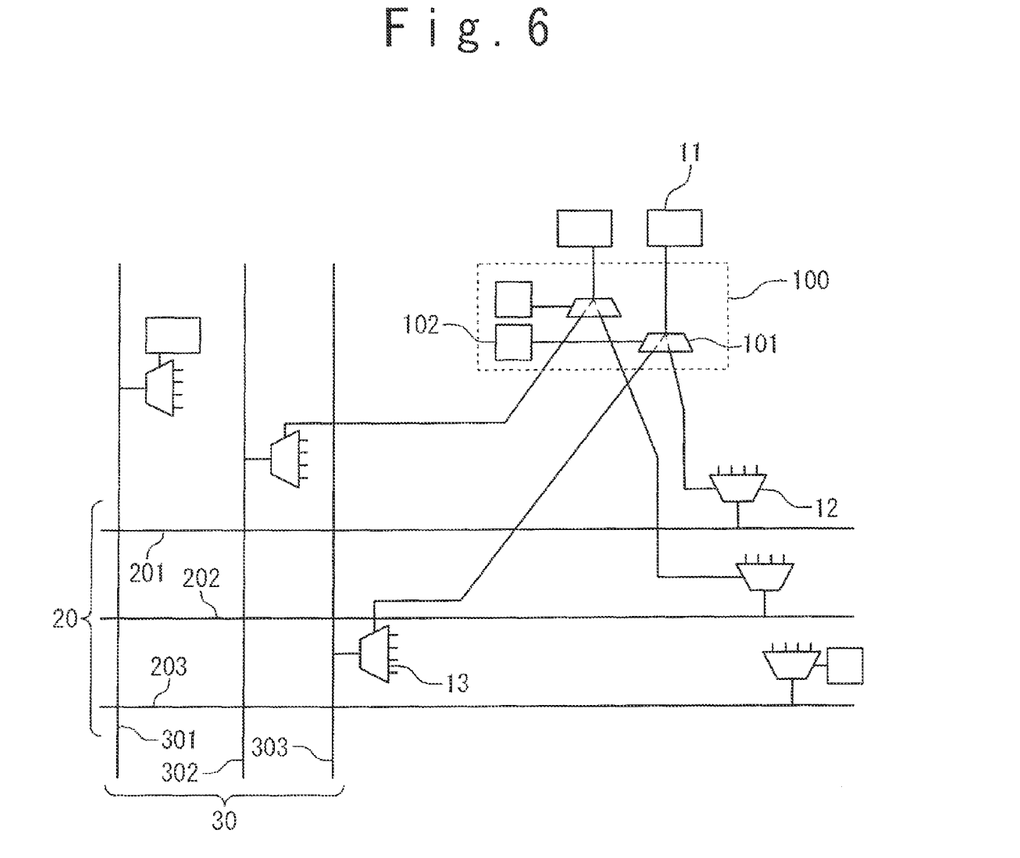
FIG. 6 is a circuit diagram showing a modification of the semiconductor integrated circuit in the first embodiment.

Also, the embodiment in which the tri-state buffers are used as the programmable switches 12, 13, and 14 is shown in the example shown in FIG. 3. The present invention is not limited to this example, and multiplexers (selectors) may be used as shown in FIG. 6. Or, MOS switches and transmission gates may be used as the programmable switches 12, 13, and 14, and any combination of them may be used, too.

Figure 7:
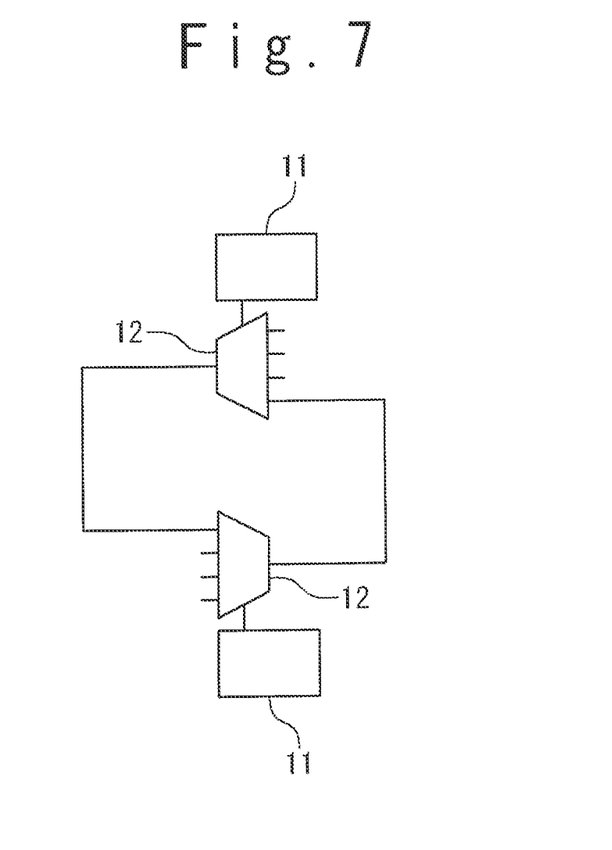
FIG. 7 is a block diagram showing the configuration of an asynchronous loop.

The interconnection connected with the switch in the invalidation state is set to the high impedance which can prevent collision on the bus. Here, in the reconfigurable circuit using the selector as the programmable switch as shown in FIG. 6, even when there is no collision on the bus, there is a possibility that an asynchronous loop occurs as shown in FIG. 7. In such a case, oscillation would occur in the asynchronous loop and an unexpected amount of power consumption would happen. Therefore, the switching circuit 101 generates data (signal) so as to compulsorily select a path which does not include any loop according to the switching data to invalidate the switch and needs to output it to the programmable switch to be invalidated.

Figure 8:
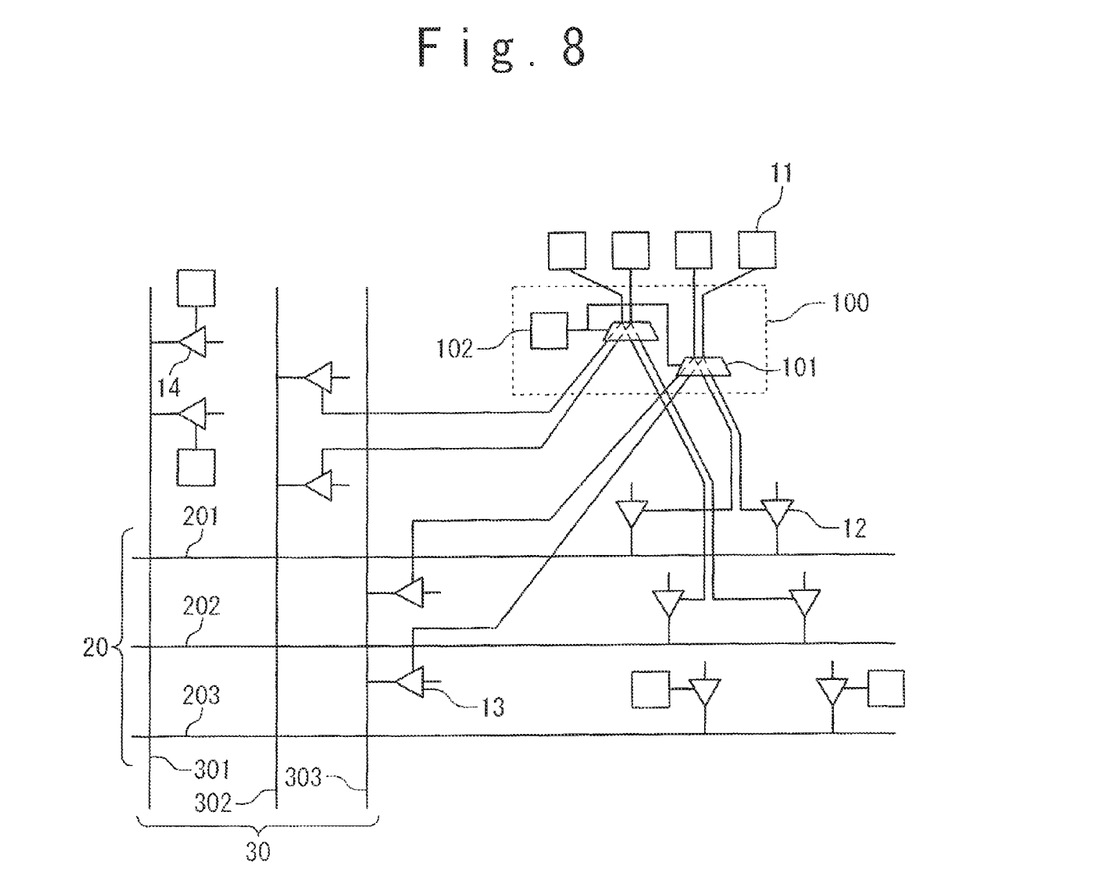
FIG. 8 is a block diagram showing another modification of the semiconductor integrated circuit in the first embodiment.

Also, the plurality of switching circuits 101 may be controlled by one switching data storage element 102, as shown in FIG. 8. Thus, it is possible to control a set of the horizontal and vertical direction programmable switches which are connected with a plurality of sets of interconnection resources by one switching data storage element 102.

In this case, the adjustment in a resource ratio of the horizontal and vertical direction programmable switches becomes rough but the control can be performed by one switching data storage element 102, so that the number of storage elements can be decreased. In an example shown in FIG. 8, it is possible to select which of the two vertical direction interconnections 302 and 303 and the two horizontal direction interconnections 201 and 202 to be validated based on the switching data stored in one switching data storage element 102. On the other hand, in the example shown in FIG. 3, the vertical direction interconnection and the horizontal direction interconnection can be switched in units of interconnections. In this way, by using a switching data storage element 102 in common, an adjustment unit becomes large but it is possible to decrease the number of switching data storage elements 102 and to reduce a circuit quantity.

In an example shown in FIGS. 3, 6 and 8, the configuration data memory is shared by only a part of horizontal and vertical direction programmable switches, but the configuration data memory may be shared by all the horizontal and vertical directions programmable switches by removing the programmable switch 14.

Second Embodiment

Figure 9:
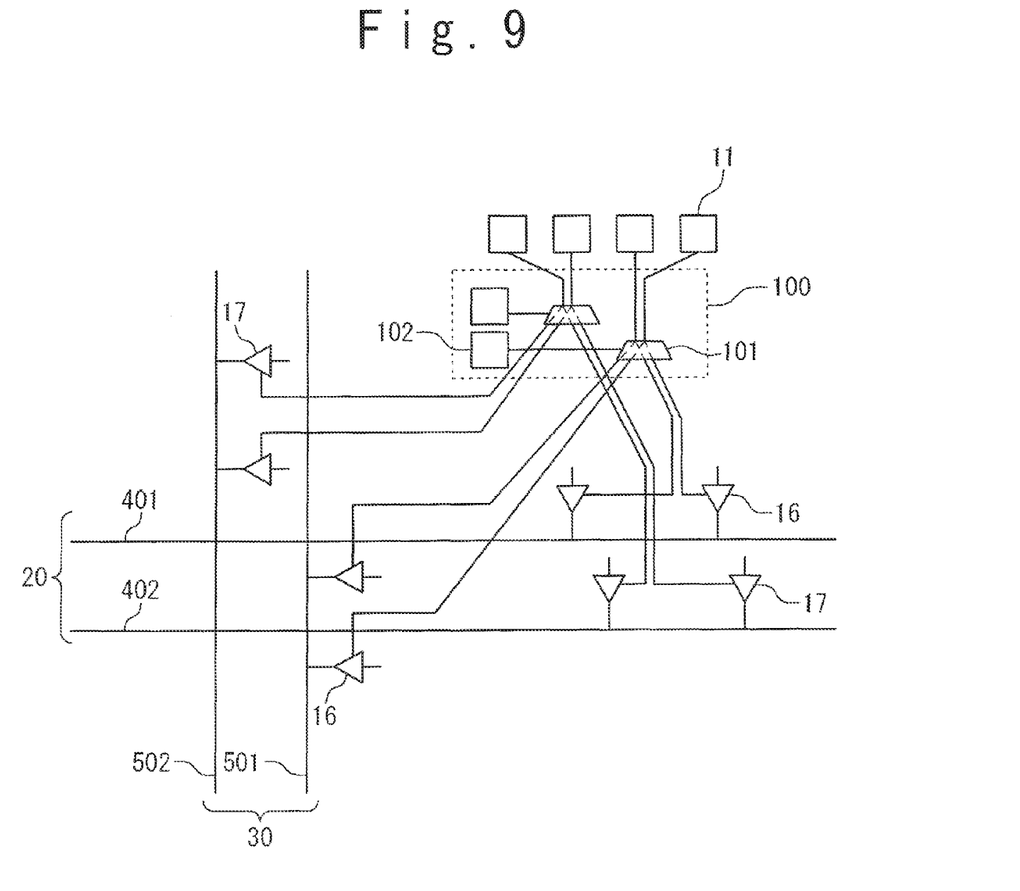
FIG. 9 is a block diagram showing the configuration of the semiconductor integrated circuit according to a second embodiment of the present invention.

In the first embodiment, the configuration and switching operation of the horizontal and vertical direction interconnection resources have been described. Here, it is possible to apply the other attributes such as an m-bit width and an n-bit width. Referring to FIG. 9, an example of the reconfigurable circuit which has the switching circuit 100 which switches m-bit and n-bit interconnection width resources will be described as the second embodiment. Here, the values n and m are natural numbers.

In the second embodiment, the bus 20 has an interconnection 401 as interconnection resources with m-bit width and has an interconnection 402 as interconnection resources with n-bit width.

Also, the bus 30 has an interconnection 501 as interconnection resources with m-bit width and has an interconnection 502 as interconnection resources with n-bit width. The switching circuit 101 in the present embodiment switches the validation and invalidation of the programmable switches 16 connected with the m-bit interconnection resources (interconnections 401 and 501) and the programmable switches 17 connected with the n-bit interconnection resources (interconnections 402 and 502) instead of the horizontal and vertical direction programmable switches. The other configuration is same as in the first embodiment.

In the present embodiment like the first embodiment, the configuration in which one of the programmable switches 16 and 17 is validated by the switching circuit 101 and the switching data storage element 102, and the configuration in which the other is invalidated can be switched.

In the conventional configuration, in an application which uses a large amount of interconnection resources of an attribute A (e.g. vertical direction or m-bit width), the configuration data memory which controls the programmable switches of an attribute B (e.g. horizontal or n-bit width) becomes wasteful. Oppositely, in an application which uses a large amount of interconnection resources of an attribute B, the configuration data memory which controls the programmable switches of the attribute A became wasteful.

Therefore, when both of the application for the attribute A, and the application for the attribute B are mapped, the reconfigurable circuit of a huge scale is required to have the interconnection resources of both the attributes in the conventional configuration. When one of the applications is installed, the attribute of the other became wasteful.

In the present invention, because the programmable switches, which are not used at a same time, for the attribute A and attribute B are controlled by the common configuration data memory, when one of the attributes A and the attributes B is set for an application which uses a large amount of memories, the number of configuration data memories which become wasteful without being used is few, compared with the conventional example. Therefore, in the reconfigurable circuit of the present invention, a plurality of applications in which a ratio of the attributes of the interconnection resources to be used is off-balanced can be mapped and the circuit quantity or circuit area can be reduced greatly.

Third Embodiment

Figure 10:
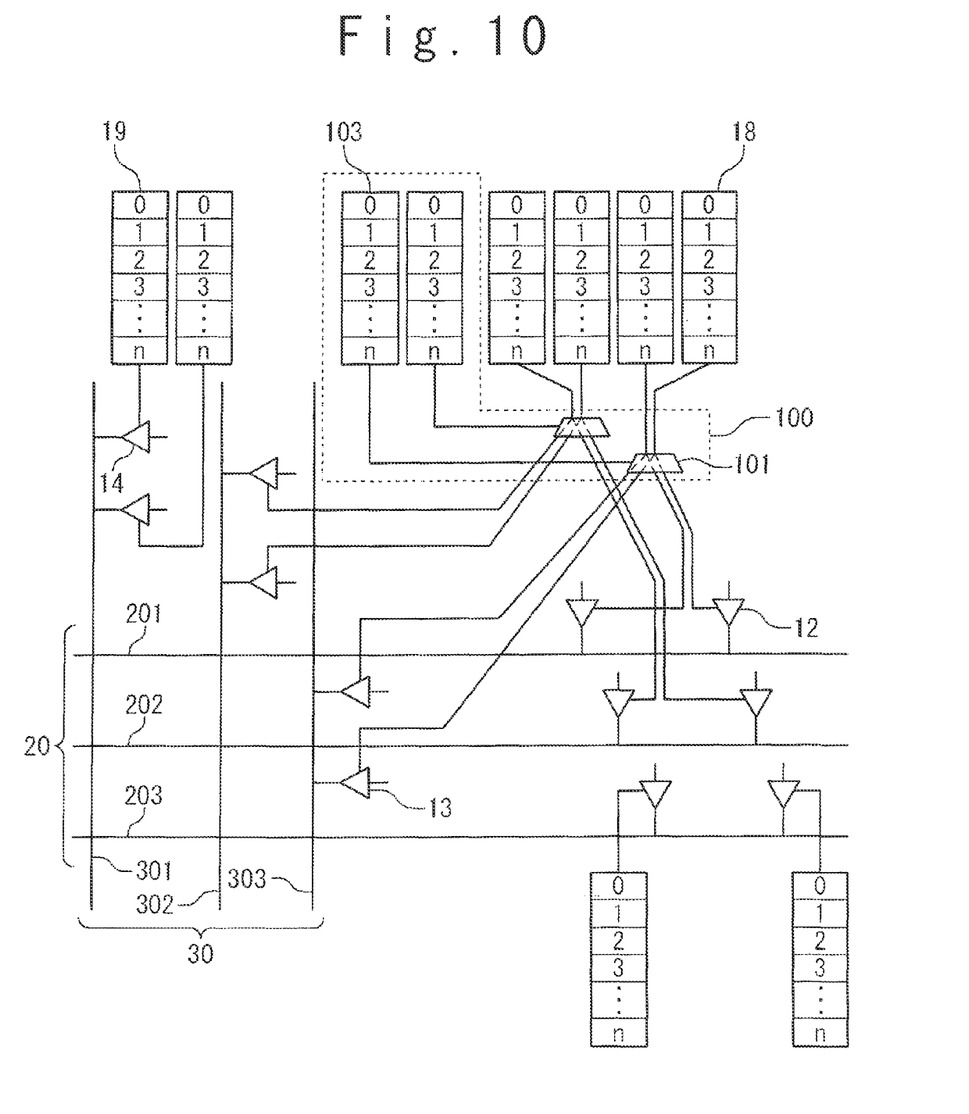
FIG. 10 is a block diagram showing the configuration of the semiconductor integrated circuit according to a third embodiment of the present invention.

The plurality of the configuration data may be stored in the configuration data memory. FIG. 10 is a block diagram showing the configuration of the semiconductor integrated circuit according to a third embodiment of the present invention. Referring to FIG. 10, the reconfigurable circuit in the third embodiment is provided with configuration data memories 18 and 19 storing the plurality of configuration data, in place of the configuration data memories 11 and 15, and switching data storage elements 103 storing the plurality of switching data are provided in place of the switching data storage elements 102. The other part of the configuration is same as that of the first embodiment. Below, the configuration and operation which are different from those of the first embodiment will be described.

The programmable switches 12 and 13 in the present embodiment are connected with the common configuration data memories 18 through the memory sharing circuit 100 (switching circuit 101). Also, the programmable switch 14 is connected with the configuration data memory 19. Moreover, the switching circuit 101 is connected with switching data storage element 103.

The plurality of switching data and the plurality of configuration data are prepared for the number of words (e.g. n words) corresponding to the plurality of applications. When the $n^{th}$ application is set, the $n^{th}$ switching data corresponding to the $n^{th}$ application is set to the switching circuit 101 from the switching data storage element 103. Also, the $n^{th}$ configuration data is set to the switching circuit 100 from the configuration data memories 18. Also, in the same way, the $n^{th}$ configuration data is set to the programmable switch 14 from the configuration data memory 19.

Since the switching data storage element 103 is a memory which has the same number of words as the configuration data memories 18 and 19, it is possible to adjust a ratio of attributes for every plane when a circuit with a nature which is different every plane (application) is mapped.

In the present invention, by making the configuration data memories to be used by the plurality of programmable switches common, the number of configuration data memories can be reduced. Such an effect is effective, especially, when the configuration data memory of a large capacity is used as in the present embodiment. Also, a part or all of the configuration data memory with a multi-bit width may be used as the switching data storage element 103. By allocating the part or all of the configuration data as the switching data in this way, the further reduction of number of circuit elements can be realized.

Fourth Embodiment

Figure 11:
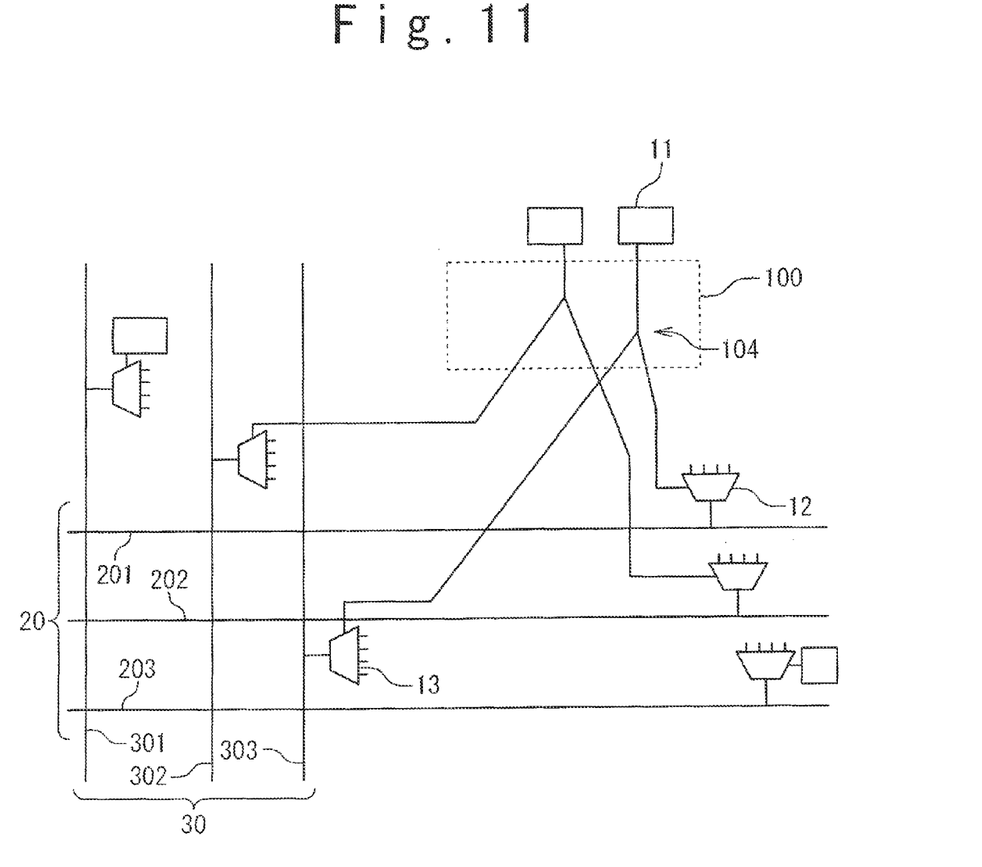
FIG. 11 is a block diagram showing the configuration of the semiconductor integrated circuit according to a fourth embodiment of the present invention.

FIG. 11 is a block diagram showing configuration of the semiconductor integrated circuit according to a fourth embodiment of the present invention. Referring to FIG. 11, when a fatal problem such as bus collision and an asynchronous loop do not occur even if the invalidated programmable switch is not set to a high impedance condition, the programmable switches 12 and 13 and the configuration data memory 11 may be connected in common by a common interconnection 104. In this case, it is possible to decrease a circuit quantity for the switching circuit 101 and the switching data storage element 102, compared with the first embodiment.

It should be noted that a user may map an application under assumption that there is no interconnection resource which is connected with the programmable switch to be invalidated. In this case, the configuration data supplied to the valid programmable switch flows into the invalidated programmable switch as meaningless data, but if oscillation due to the bus collision/the asynchronous loop does not happen, there is not a problem. For example, when not employing a tri-state bus, the bus collision does not happen. Moreover, in a case that the asynchronous loop does not happen, even if a control of the invalidated programmable switch is eliminated, there is not any actual problem in such a configuration. In such a case, it is preferable to apply the present embodiment.

In the reconfigurable circuit of the present invention, the configuration data memories can be decreased, but the memory sharing circuit 100 is added, instead. However, since the memory sharing circuit 100 is equivalent or simpler in configuration to or than the switching circuit 101, the switching data storage element 102 or the common interconnection 104, the increase in area is little.

As described above, the number of configuration data memories can be greatly decreased by collectively controlling the plurality of programmable switches which are not used at the same time based on one configuration data, and the area can be reduced while maintaining flexibility.

Although the embodiments of the present invention have been described in detail, specific configuration is not limited to the above embodiments and a modification which is not apart from the spirit of the present invention is contained in the present invention. Also, the first to fourth embodiments can be combined in a range in which there is not technical contradiction.

When the switching circuit 101 is omitted in the first embodiment, there is a case that the bus fight and the asynchronous loop have occurred. However, it is possible to realize the present invention by replacing an interconnection layer and switching the contents of the switching circuit 101, without setting the switching circuit 101 by the switching data storage element 102. For example, one configuration data memory 11 connected with the programmable switches 12 and 13 is prepared in advance in a circuit pattern design, and by connecting only one of the interconnections in a manufacturing process, the wasteful formation of the configuration data memory can be saved.

In this case, unlike the first to fourth embodiments, the switching after shipping is impossible, but the plurality of types of reconfigurable circuits which have different characteristics can be developed cheaply. At this time, when the configuration is changed and remanufactured in quantities, a redesigning cost and a mask cost can be mainly reduced, but can not be changed after making. However, the area can be made the smallest of the above-mentioned embodiments.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. A method of switching a configuration of a semiconductor integrated circuit, comprising:
   selecting one of a plurality of programmable switches which is supplied with a configuration data from one configuration data memory, wherein said plurality of programmable switches are tri-state buffers, transmission gates and MOS (Metal Oxide Semiconductor) transistors,
   connecting functional blocks based on the configuration data by said selected programmable switch;
   connecting said selected programmable switch with said one configuration data memory; and
   controlling an output of each of said plurality of programmable switches other than said selected programmable switch connected with said one configuration data memory, based on a control signal,
   wherein said selecting one of a plurality of programmable switches further comprises setting the control signal to a high impedance state, and outputting the control signal.

2. The method of claim 1, wherein said functional blocks are arranged in a matrix, row direction interconnection resources extend in a horizontal direction of said functional blocks, and column direction interconnection resources extend in a vertical direction of said functional blocks,
   connecting one of said column direction interconnection resources with a first switch of said plurality of programmable switches, and
   connecting one of said row direction interconnection resources with a second switch of said plurality of programmable switches,
   wherein said selecting one of a plurality of programmable switches further comprises selecting one of said first switch and said second switch as said selected programmable switch which is to be connected with said one configuration data memory.

3. The method of claim 1, further comprising:
   a first interconnection resource with an n-bit width; and
   a second interconnection resource with an m-bit width,
   wherein said n and said m are natural numbers, connecting said first interconnection resource and a first switch of said plurality of programmable switches, connecting said second interconnection resource and a second switch of said plurality of programmable switches, wherein said selecting one of a plurality of programmable switches further comprises selecting one of said first switch and said second switch as said programmable switch which is to be connected with said one configuration data memory.

4. The method of claim 1, further comprising:

connecting said one configuration data memory and said plurality of programmable switches in common with a common interconnection.

5. A method of switching a configuration of a semiconductor integrated circuit, comprising:

selecting one of a plurality of programmable switches which is supplied with a configuration data from one configuration data memory, wherein said plurality of programmable switches are multiplexers, connecting functional blocks based on the configuration data by said selected programmable switch; and controlling an output of each of said plurality of programmable switches other than said selected programmable switch connected with said one configuration data memory, based on control data, and wherein said selecting one a plurality of programmable switches further comprises setting the control data to a predetermined value, and outputting the control data.

6. The method of claim 5, wherein said functional blocks are arranged in a matrix, row direction interconnection resources extend in a horizontal direction of said functional blocks, and column direction interconnection resources extend in a vertical direction of said functional blocks, connecting one of said column direction interconnection resources with a first switch of said plurality of programmable switches, and connecting one of said row direction interconnection resources with a second switch of said plurality of programmable switches, wherein said selecting one of a plurality of programmable switches further comprises selecting one of said first switch and said second switch as said selected programmable switch which is to be connected with said one configuration data memory.

7. The method of claim 5, further comprising:

a first interconnection resource with an n-bit width; and a second interconnection resource with an m-bit width, wherein said n and said m are natural numbers, connecting said first interconnection resource and a first switch of said plurality of programmable switches, connecting said second interconnection resource and a second switch of said plurality of programmable switches, wherein said selecting one of a plurality of programmable switches further comprises selecting one of said first switch and said second switch as said programmable switch which is to be connected with said one configuration data memory.

8. The method of claim 5, further comprising:

connecting said one configuration data memory and said plurality of programmable switches in common with a common interconnection.

* * * * *